(12) United States Patent
Silaika

(10) Patent No.: US 8,155,329 B1
(45) Date of Patent: Apr. 10, 2012

(54) METHOD FOR MONITORING OUTSIDE SOUND THROUGH A CLOSED WINDOW AND DEVICE THEREFOR

(76) Inventor: Scott Clinton Silaika, Queensbury, NY (US)

( * ) Notice: Subject to any disclaimer, the term of this patent is extended or adjusted under 35 U.S.C. 154(b) by 1034 days.

(21) Appl. No.: 12/082,527

(22) Filed: Apr. 11, 2008

Related U.S. Application Data

(60) Provisional application No. 60/934,744, filed on Jun. 15, 2007.

(51) Int. Cl.
*H03G 3/20* (2006.01)

(52) U.S. Cl. .............. 381/57; 381/56; 381/58; 381/91; 340/539.15

(58) Field of Classification Search ............. 381/57, 381/56, 58, 91; 340/539.15
See application file for complete search history.

(56) References Cited

U.S. PATENT DOCUMENTS

| 3,158,835 | A * | 11/1964 | Hipkins ................... 340/902 |
| 5,243,659 | A * | 9/1993 | Stafford et al. ................ 381/86 |
| 7,193,512 | B1 * | 3/2007 | Coulthard ..................... 340/531 |
| 2006/0177071 | A1 * | 8/2006 | Eskildsen ....................... 381/56 |
| 2006/0220884 | A1 * | 10/2006 | Thompson ................... 340/573.1 |
| 2007/0003075 | A1 * | 1/2007 | Cooper et al. ................. 381/98 |

* cited by examiner

*Primary Examiner* — Zandra Smith
*Assistant Examiner* — Errol Fernandes
(74) *Attorney, Agent, or Firm* — Ted Masters

(57) ABSTRACT

A device for monitoring outside sound through a closed window includes a housing positioned inside the window. The housing contains a filter, a squelch circuit, an amplifier, and a speaker. A microphone is positioned outside the window and connected to the housing. The housing includes a volume control, a sensitivity control, and a mode control for bypassing the squelch circuit.

14 Claims, 3 Drawing Sheets

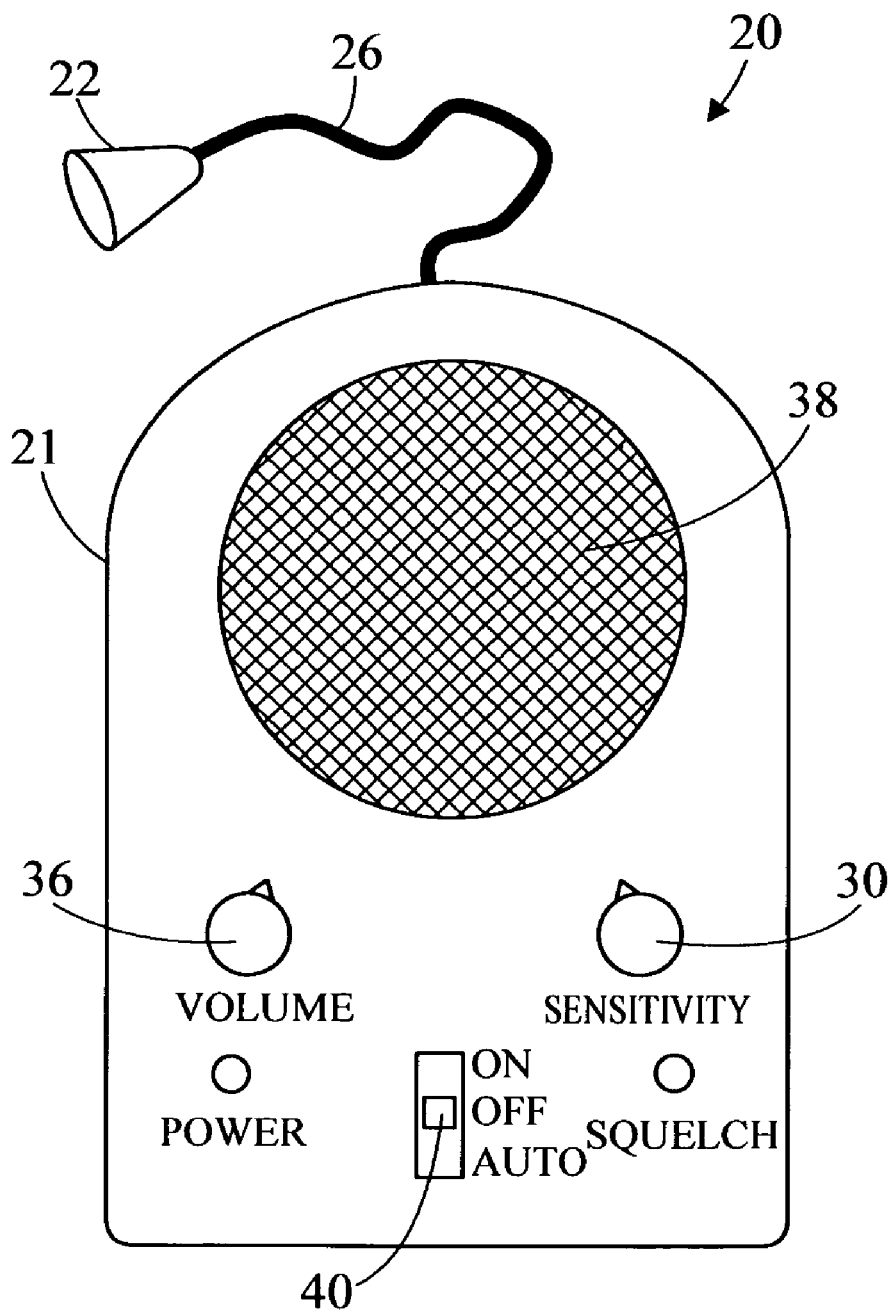

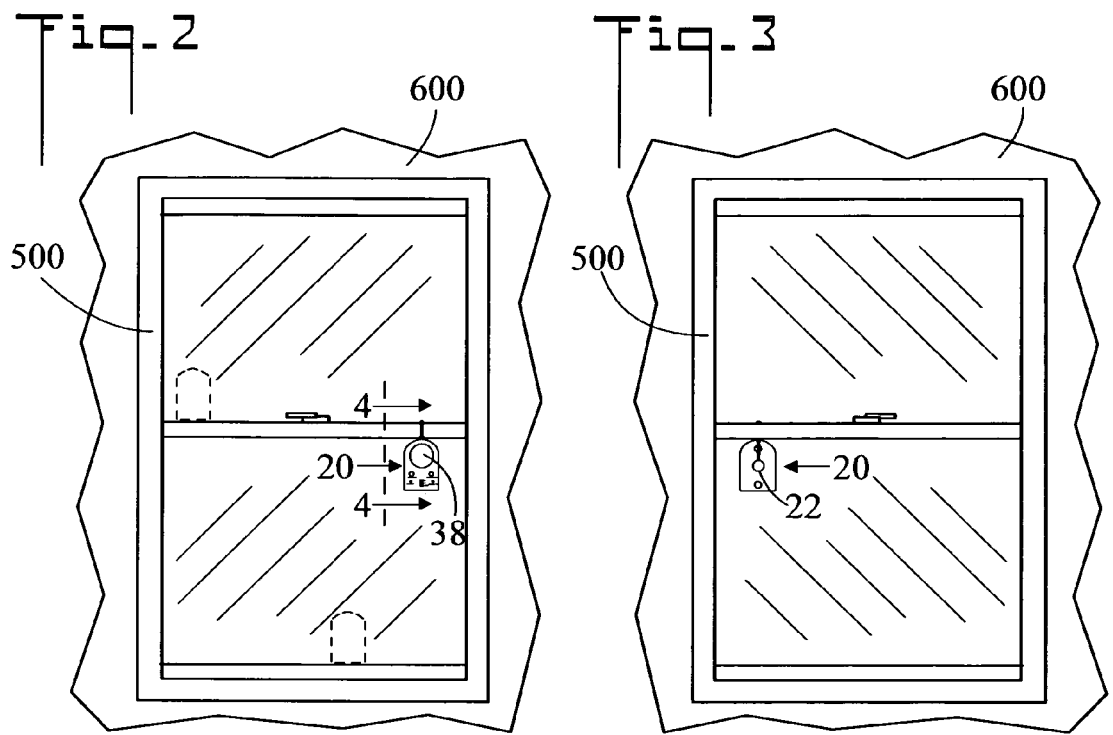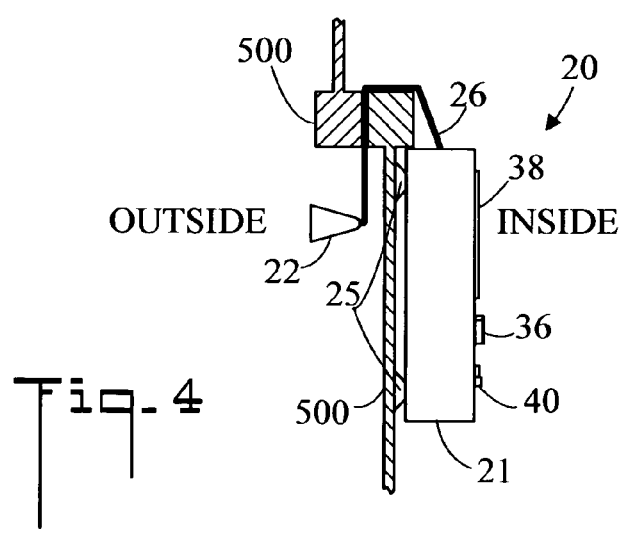

METHOD FOR MONITORING OUTSIDE SOUND THROUGH A CLOSED WINDOW AND DEVICE THEREFOR

CROSS REFERENCE TO RELATED APPLICATION

This application claims the filing benefit under 35 U.S.C. §119(e) of U.S. Provisional Application No. 60/934,744, filed Jun. 15, 2007, which is herein incorporated by reference.

TECHNICAL FIELD

The present invention pertains generally to sound monitoring devices, and more particularly to a method and device for monitoring outside sound from inside a structure through a closed window.

BACKGROUND OF THE INVENTION

As the thermal insulating properties of windows have increased in the recent years, the transmission of sound has proportionally decreased. This has isolated the interior of the home (or other structure) from many sounds occurring outside. Also, for safety reasons, it is becoming increasingly important to be able to monitor the status of children playing outside the home. While opening of windows does allow a parent/caregiver to hear children, many times it is not practical to have an open window, especially during very warm or cool weather when HVAC systems are operational. When the window is closed, it can be difficult to hear sounds emanating from outside the structure. It is therefore desirable to have a system to monitor sounds through a closed window that can be easily and reversibly mounted to a window.

Monitoring children outside can be a problem with known baby monitors. When the sensing/transmitting unit is placed on the exterior side of a window, batteries will drain very quickly since the unit is continuously transmitting the signal to the receiver using an antenna. Opening the window to constantly turn on and off the unit is not practical. Therefore, what is needed is an audio monitor that can be easily mounted on a window to receive sounds from the outside and reproduce the sounds within the interior of the home.

BRIEF SUMMARY OF THE INVENTION

The present invention is directed to a window mounted audio monitor for monitoring outside sound through the closed window. The device includes a microphone which is positioned on the window exterior and may be protected from the elements to enhance durability. The speaker is positioned on the window interior to allow for audio monitoring when the window is closed. The invention will receive sounds from the exterior side of a window, modify or process the sounds, and transmit the modified sounds to the interior side of a window. The sound processing device may include pre-amplification, amplification, gain control, volume control, frequency filtration, frequency enhancement, or other sound processing capabilities. These sound processing units may be based on analog or digital circuitry, and may be used individually or in combination to reduce undesired sounds and enhance desired sounds.

One target use for the present invention is to allow adults to easily and effectively monitor the voices of children playing outdoors. By using the present invention, the adult is able to hear the sounds of a child in distress even though the window is closed. With amplification of the outdoor sounds the child would still be audible even over loud internal sounds such as a television set or a running air conditioning unit. Another possible application is to use the device throughout the night to enhance security by detecting unusual sounds such as a forced entry.

Useful features of the present invention are:
- User controls are on the interior of the structure. These allow the user to turn the device on or off, control the volume, control the desired sound threshold (sensitivity), and bypass the squelch circuit.
- The device picks up sound from the local vicinity, as a baby monitor would, and also picks up sound from further distances. In some cases, voices can be clearly understood from over 100 feet away. This does not require a parabolic dish or sound collection dish.
- Sound activated—The present invention has a squelch circuit that is user set to the desirable sound threshold level. Once sound exceeds this level, the amplifier/speaker is operational.
- Timed operation—When the invention is operating (squelch circuit closed) it does so for only a pre-set, fixed time period. Any sound that exceeds the threshold during this time period will then reset the timer to start over. This allows the invention to operate as long as there is an adequate level of sound present, otherwise it reverts to a low power (standby) state.
- Low power amplifier—When the invention is in the low power state (squelch circuit open) very little power is required, increasing battery life.
- Sound quality—The invention uses band pass filters to reduce low frequency sound from passing cars and garden equipment, reduce high frequency sound to limit feedback, while still maintaining the transmission of desirable sounds such as human voices.
- Integrated, single device—Unlike baby monitors that have separate transmitter and receiver units, the invention has all components (microphone, amplifier, and speaker) in one unit and powered by a single DC current source.
- Mounting. The invention is securely and releasably mounted on a window, window frame, or window sill. Sound transmission may be enhanced with the use of vibration isolation devices such as soft feet or a suction cup.
- Weatherproofing. The microphone component of the invention is protected from the elements and designed for outdoor use. This may include a cone-shaped shroud or a traditional foam windscreen treated for water resistance. The microphone enclosure may also assist in sound collection.

In accordance with a preferred embodiment of the invention, a device for monitoring outside sound through a window include a microphone for detecting the outside sound and generating an electronic signal representative thereof. A filter is connected to the microphone, filters the electronic signal, and outputs a filtered signal. A squelch circuit is connected to the filter, detects the level of the filter signal, and only passes the signal if the signal level is above a pre-established threshold level. An amplifier is connected to the squelch circuit, and amplifies the filtered signal passed by the squelch circuit. A speaker is connected to the amplifier, and converts the amplified filtered signal into sound. The filter, squelch circuit, amplifier, and speaker are positioned inside of the window, and the microphone is positioned outside of the window.

In accordance with an aspect of the invention, the filter is a bandpass filter which passes frequencies of between about 200 hertz and about 4,000 hertz.

In accordance with another aspect of the invention, the squelch circuit includes a sensitivity control which allows selective setting of the threshold level of the filtered signal.

In accordance with another aspect of the invention, the squelch circuit has a level detector for detecting the level of the filtered signal. The squelch circuit also has a timer which counts a fixed period of time. When the level detector detects that the filtered signal is above the threshold level, (1) the timer turns on for the fixed period of time, and (2) for the fixed period of time the squelch circuit passes the filtered signal to the amplifier.

In accordance with another aspect of the invention, if during the fixed period of time the level detector detects that the filtered signal is again above the threshold level, the timer is reset and starts a new fixed period of time.

In accordance with another aspect of the invention, after the fixed period of time has elapsed, the device enters a low power state.

In accordance with another aspect of the invention, the amplifier has a volume control which allows selective setting of a level of signal amplification.

In accordance with another aspect of the invention, a mode control selectively bypasses the squelch circuit and causes the filtered signal from the filter to be routed directly to the amplifier.

In accordance with another aspect of the invention, housing contains the filter, the squelch circuit, the amplifier, and the speaker.

Other aspects of the present invention will become apparent from the following detailed description, taken in conjunction with the accompanying drawings, which illustrate, by way of example, the principles of the invention.

BRIEF DESCRIPTION OF THE DRAWINGS

FIG. 1 is a front elevation view of a device for monitoring outside sound through a closed window in accordance with the present invention;

FIG. 2 is a reduced inside elevation view of the device mounted on a window;

FIG. 3 is a reduced outside elevation view of the device mounted on the window;

FIG. 4 is a cross sectional view along the line 4-4 of FIG. 2; and,

DETAILED DESCRIPTION OF THE INVENTION

Figure 5:
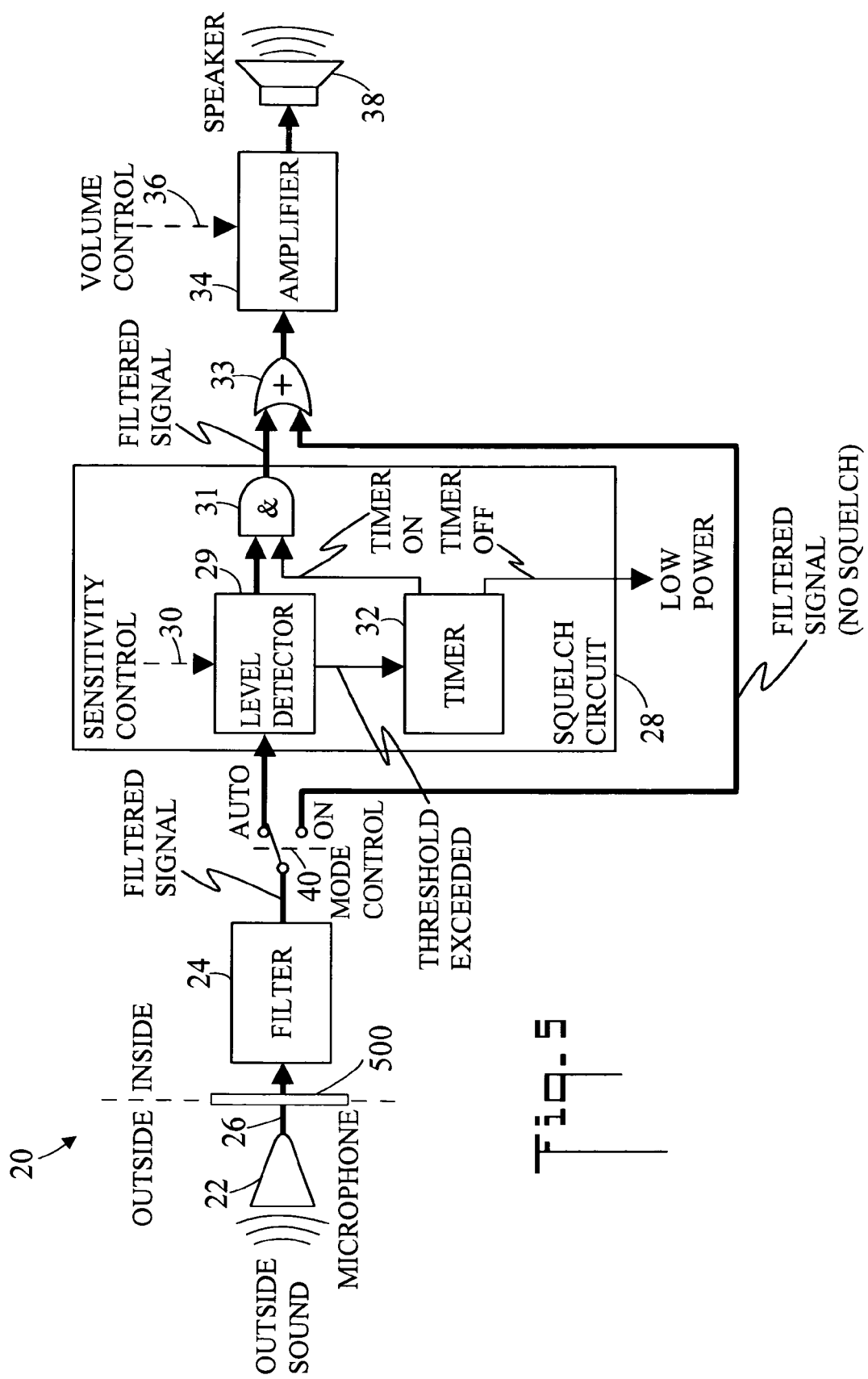
FIG. 5 is a functional block diagram of the device.

Referring to FIGS. 1-5, there is illustrated a device for monitoring outside sound through a closed window 500 of a structure 600 in accordance with the present invention, generally designated as 20. FIG. 2 is a reduced inside elevation view of device 20 mounted on a window 500. FIG. 3 is a reduced outside elevation view of device 20 mounted on window 500. FIG. 4 is a cross sectional view along the line 4-4 of FIG. 2, and FIG. 5 is a functional block diagram of device 20.

Device 20 includes a microphone 22 for detecting the outside sound and generating an electronic signal representative thereof. In one embodiment of the invention, microphone 22 is a general purpose, electret, omni-directional microphone 22. However, the invention may also utilize a specific microphone type including dynamic, ribbon or condenser. In addition the microphone pickup pattern may be unidirectional, carotid, or another pattern. Microphone 22 may also be weatherproofed or include a windscreen.

A filter 24 is connected to microphone 22 by an electrical conductor 26 such as a wire, which is routed from outside to inside between the two sashes, or between the sash and sill of closed window 500. Filter 24 filters the electronic signal received from microphone 22 and outputs a filtered signal. In an embodiment of the invention, filter 24 is a bandpass filter which passes frequencies of between about 200 hertz and about 4,000 hertz. Low frequencies from passing cars, distant lawn mowers, and other motorized equipment are undesirable for an audio monitor designed to listen in the human voice frequency range. Conversely, high frequencies can contribute to unacceptable levels of feedback. The present invention enhances the frequencies of interest using band pass filters, allowing for greater amplification of desirable sounds in the "voice frequency band".

A squelch circuit 28 is connected to filter 24, and detects a level of the filtered signal. Squelch circuit 28 only passes the filtered signal if the level is above a threshold level. Squelch circuit 28 has a level detector 29 for detecting the level of the filtered signal. It is noted that filter 24 is specifically disposed in front of squelch circuit 28 so that undesirable high and low frequency sounds will not trigger squelch circuit 28. Squelch circuit 28 includes a sensitivity control 30 which allows selective setting of the threshold level of the filtered signal. The higher the sensitivity control setting, the higher the threshold level it takes to trigger squelch circuit 28.

Squelch circuit 28 further includes a timer 32 which counts a fixed period of time (for example 10 seconds). When level detector 29 detects that the filtered signal is above the threshold level, (1) timer 32 turns on for the fixed period of time, and (2) for the fixed period of time squelch circuit 28 passes the filtered signal to amplifier 34. In other words, if timer 32 is on, it causes the filtered signal to be routed to amplifier 34. Timer 32 ensures that squelch circuit 28 will not "chatter" (turn on and then immediately off). In FIG. 5, this "gating" is shown by logical AND (&) gate 31. If during the fixed period of time level detector 29 detects that the filtered signal is again above the threshold level, timer 32 is reset and starts a new fixed period of time. Also, after the fixed period of time has elapsed, device 20 enters a low power (standby) state thereby conserving power (i.e. preserving battery life).

Amplifier 34 is connected to squelch circuit 28, and amplifies the filtered signal passed by squelch circuit 28. Amplifier 34 has a volume control 36 which allows selective setting of a level of signal amplification. A speaker 38 is connected to amplifier 34 and converts the amplified filtered signal into sound.

Device 20 further includes a mode control 40 for selectively bypassing squelch circuit 28 and causing the filtered signal from filter 24 to be routed directly to amplifier 34. That is, device 20 may be set to either an "ON" or an "AUTO" mode. In the AUTO mode, squelch circuit 28 maintains device 20 in a low power (standby) state until the user-set (by sensitivity control 30) filtered signal threshold level is detected. Once outside sound above the threshold level is detected, timer 32 then turns device 20 for the fixed period of time. During the period of time, if the outside sound again exceeds the threshold level, timer 32 is reset to its starting point. Once there has been a full period of time with no detectable sounds above the threshold, squelch circuit 28 and timer 32 return device 20 to the low power state. This functionality maximizes battery life and allows users to set up the invention to their preferences. Once the initial setup is complete, the invention detects and reproduces only the desired levels of sound. This allows the user to either listen to a large number of softer sounds, or a small number of louder sounds. The selection of either the filtered signal with squelch (AUTO) or the filtered signal without squelch (ON) is represented on FIG. 5 by logical OR (+) gate 33.

Referring to FIGS. 2-4, it is noted that filter 24, squelch circuit 28, amplifier 34, and speaker 38 are positionable inside of window 500, and microphone 22 is positionable outside of window 500. To that end, filter 24, squelch circuit 28, amplifier 34, and speaker 38 are contained with a single housing 21 (refer to FIG. 1), which is mounted inside window 500, and microphone 22 is mounted outside window 500. Referring to FIG. 4, in the shown embodiment, device 20 is mounted directly to the glass of window 500 using suction cups 25. However, it may be appreciated that device 20 may also have other mounting arrangements such as a flat surface on which to stand, permanent or temporary adhesives, or other mechanical fastening mechanisms. Other mounting locations of device 20 are shown in dashed lines in FIG. 2.

In terms of power, in an embodiment of the invention device 20 uses a wired microphone 22 to transmit sounds to the amplification and speaker circuits. This reduces power consumption since there is no wireless transmission. In an embodiment device 20 is battery powered using either rechargeable or replaceable batteries, which are contained within housing 21. The controls of device 20 reside on the interior side of the window, so the batteries and circuitry are not exposed to extreme weather conditions. Additionally, electrical power for DC use is usually available nearby on the interior of the structure. Device 20 may also be powered by other means. One option is to include a solar panel on the exterior to power the unit or to improve battery life. Another option is a rechargeable unit where the battery may be recharged.

In the shown embodiment device 20 is controlled with an ON/AUTO/OFF switch. The invention may also be controlled by other means. One option is a timer to allow intermittent or scheduled operation by means of a timer or similar device. Yet another option is the use of a photodiode to control the invention based upon illumination level.

In an embodiment of the invention, device 20 has a band pass filter consisting of both a low pass filter and a high pass filter to enhance desirable sounds such as voices, while suppressing undesirable sounds such as background noise from distant traffic. The invention may also have other sound processing components such as notch filters, sound cancellation, or other means of frequency modification. These and other technologies are able to enhance or suppress selected frequencies.

In terms of use, a method for monitoring outside sound through a closed window 500 includes:

(a) providing a structure 600 having a closeable window 500;

(b) providing a device 20 for monitoring outside sound through the window 500, device 20 including:

a microphone 22 for detecting the outside sound and generating an electronic signal representative thereof;

a filter 24 connected to the microphone 22, filter 24 filtering the electronic signal and outputting a filtered signal;

a squelch circuit 28 connected to filter 24, squelch circuit 28 detecting a level of the filtered signal, and only passing the filtered signal if the level is above a threshold level;

an amplifier 34 connected to squelch circuit 28, amplifier 34 amplifying the filtered signal passed by squelch circuit 28;

a speaker 38 connected to amplifier 34, speaker 38 converting the amplified filtered signal into sound;

a housing 21 which contains filter 24, squelch circuit 28, amplifier 34, and 38 speaker;

(c) positioning microphone 22 outside of window 500;

(d) positioning housing 21 inside of window 500;

(e) closing window 500; and, (f) activating device 20.

The method further including:

in step (b), squelch circuit 28 including a sensitivity control 30 which allows selective setting of the threshold level of the filtered signal; and, after step (f), using sensitivity control 30 to set a desired threshold level of the filtered signal.

The method further including:

in step (b), amplifier 34 having a volume control 36 which allows selective setting of a level of signal amplification; and, after step (f), using volume control 36 to set a desired level of signal amplification.

The method further including:

in step (b), device 20 including a mode control 40 for selectively bypassing squelch, circuit 28 and causing the filtered signal from filter 24 to be routed directly to amplifier 34; and, using mode control 40 to bypass squelch circuit 28.

The preferred embodiments of the invention described herein are exemplary and numerous modifications, variations, and rearrangements can be readily envisioned to achieve an equivalent result, all of which are intended to be embraced within the scope of the appended claims.

I claim:

1. A method for monitoring outside sound through a closed window, comprising:

(a) providing a structure having a closeable window;

(b) providing a device for monitoring outside sound through said window, said device including:

a microphone for detecting the outside sound and generating an electronic signal representative thereof;

a filter connected to said microphone, said filter filtering said electronic signal and outputting a filtered signal;

a squelch circuit connected to said filter, said squelch circuit detecting a level of said filtered signal, and only passing said filtered signal if said level is above a threshold level;

an amplifier connected to said squelch circuit, said amplifier amplifying said filtered signal passed by said squelch circuit;

a speaker connected to said amplifier, said speaker converting said amplified filtered signal into sound;

a housing which contains said filter, said squelch circuit, said amplifier, and said speaker;

(c) positioning said microphone outside of said window;

(d) positioning said housing inside of said window;

(e) closing said window; and, (f) activating said device.

2. The method of claim 1, further including:

in step (b), said squelch circuit including a sensitivity control which allows selective setting of said threshold level of said filtered signal; and, after step (f), using said sensitivity control to set a desired threshold level of said filtered signal.

3. The method of claim 1, further including:

in step (b), said amplifier having a volume control which allows selective setting of a level of signal amplification; and, after step (f), using said volume control to set a desired level of signal amplification.

4. The method of claim 1, further including:

in step (b), said device including a mode control for selectively bypassing said squelch circuit and causing said filtered signal from said filter to be routed directly to said amplifier; and, using said mode control to bypass said squelch circuit.

5. A device for monitoring outside sound through a closed window, comprising:

a microphone for detecting the outside sound and generating an electronic signal representative thereof;

a filter connected to said microphone, said filter filtering said electronic signal and outputting a filtered signal;

a squelch circuit connected to said filter, said squelch circuit detecting a level of said filtered signal, and only passing said filtered signal if said level is above a threshold level;

an amplifier connected to said squelch circuit, said amplifier amplifying said filtered signal passed by said squelch circuit;

a speaker connected to said amplifier, said speaker converting said amplified filtered signal into sound; and, wherein said filter, said squelch circuit, said amplifier, and said speaker are positionable inside of the window, and said microphone is positionable outside of the window.

6. The device according to claim 5, further including:

said filter being a bandpass filter which passes frequencies of between about 200 hertz and about 4,000 hertz.

7. The device according to claim 5, further including:

said squelch circuit including a sensitivity control which allows selective setting of said threshold level of said filtered signal.

8. The device according to claim 5, further including:

said squelch circuit having a level detector for detecting said level of said filtered signal;

said squelch circuit having a timer, said timer counting a fixed period of time; and, when said level detector detects that said filtered signal is above said threshold level, (1) said timer turning on for said fixed period of time, and (2) for said fixed period of time said squelch circuit passing said filtered signal to said amplifier.

9. The device according to claim 8, further including:

if during said fixed period of time said level detector detects that said filtered signal is again above said threshold level, said timer being reset and starting a new fixed period of time.

10. The device according to claim 8, further including:

after said fixed period of time has elapsed, said device entering a low power state.

11. The device according to claim 5, further including:

said amplifier having a volume control which allows selective setting of a level of signal amplification.

12. The device according to claim 5, further including:

a mode control for selectively bypassing said squelch circuit and causing said filtered signal from said filter to be routed directly to said amplifier.

13. The device according to claim 5, further including a housing which contains said filter, said squelch circuit, said amplifier, and said speaker.

14. The device according to claim 5, further including:

said filter being a bandpass filter which passes frequencies of between about 200 hertz and about 4,000 hertz;

said squelch circuit including a sensitivity control which allows selective setting of said threshold level of said filtered signal;

said squelch circuit having a level detector for detecting said level of said filter signal;

said squelch circuit having a timer, said timer counting a fixed period of time; and, when said level detector detects that said filtered signal is above said threshold level, (1) said timer turning on for said fixed period of time, and (2) for said fixed period of time said squelch circuit passing said filtered signal to said amplifier;

if during said fixed period of time said level detector detects that said filtered signal is again above threshold level, said timer being reset and starting a new fixed period of time;

after said fixed period of time has elapsed, said device entering a low power state;

said amplifier having a volume control which allows selective setting of a level of signal amplification;

a mode control for selectively bypassing said squelch circuit and causing said filtered signal from said filter to be routed directly to said amplifier; and, a housing which contains said filter, said squelch circuit, said amplifier, and said speaker.

\* \* \* \* \*